US009978897B2

(12) United States Patent
Aussedat et al.

(10) Patent No.: US 9,978,897 B2
(45) Date of Patent: May 22, 2018

(54) THERMOPLASTIC COMPOSITION, IN PARTICULAR FOR PHOTOVOLTAIC MODULES

(71) Applicant: ARKEMA FRANCE, Colombes (FR)

(72) Inventors: Grégoire Aussedat, Paris (FR); Dominique Jousset, Bougival (FR); Stéphane Bizet, Barc (FR); Jean-Jacques Flat, Goupillieres (FR); Samuel Devisme, Rouen (FR)

(73) Assignee: ARKEMA FRANCE, Colombes (FR)

( * ) Notice: Subject to any disclaimer, the term of this patent is extended or adjusted under 35 U.S.C. 154(b) by 244 days.

(21) Appl. No.: 15/024,673

(22) PCT Filed: Sep. 17, 2014

(86) PCT No.: PCT/FR2014/052313
§ 371 (c)(1),
(2) Date: Mar. 24, 2016

(87) PCT Pub. No.: WO2015/044560
PCT Pub. Date: Apr. 2, 2015

(65) Prior Publication Data

US 2016/0247953 A1 Aug. 25, 2016

(30) Foreign Application Priority Data

Sep. 24, 2013 (FR) ..................................... 13 59174

(51) Int. Cl.

| | |
|---|---|
| ***H01L 31/048*** | (2014.01) |
| ***A01B 39/16*** | (2006.01) |
| ***A01B 39/18*** | (2006.01) |
| ***H01L 31/049*** | (2014.01) |
| ***C09D 177/00*** | (2006.01) |
| *C08J 5/18* | (2006.01) |

(52) U.S. Cl.
CPC ........ *H01L 31/0481* (2013.01); *A01B 39/166* (2013.01); *A01B 39/18* (2013.01); *C09D 177/00* (2013.01); *H01L 31/049* (2014.12); *C08J 5/18* (2013.01); *C08J 2387/00* (2013.01); *C08L 2205/02* (2013.01); *C08L 2205/03* (2013.01); *Y02E 10/50* (2013.01); *Y02P 60/12* (2015.11)

(58) Field of Classification Search
CPC . H01L 31/0481; H01L 31/049; A01B 39/166; A01B 39/18; C09D 177/00
See application file for complete search history.

(56) References Cited

U.S. PATENT DOCUMENTS

| | | | | |
|---|---|---|---|---|
| 2003/0199635 | A1 | 10/2003 | Court et al. | |
| 2004/0024127 | A1 * | 2/2004 | Baumert ................ | C09J 123/02 525/178 |
| 2011/0091707 | A1 * | 4/2011 | Jousset .................. | B32B 27/28 428/220 |
| 2011/0315199 | A1 | 12/2011 | Vogt et al. | |
| 2014/0000707 | A1 | 1/2014 | Bizet et al. | |
| 2014/0014180 | A1 | 1/2014 | Bizet et al. | |

FOREIGN PATENT DOCUMENTS

| | | | |
|---|---|---|---|
| EP | 1 342 764 | A2 | 9/2003 |
| EP | 2 196 489 | A1 | 6/2010 |
| FR | 2912150 | A1 | 8/2008 |
| WO | WO 02/28959 | A1 | 4/2002 |
| WO | WO 2009/138679 | A1 | 11/2009 |
| WO | WO 2012/085369 | A1 | 6/2012 |
| WO | WO 2012/107654 | A1 | 8/2012 |

OTHER PUBLICATIONS

International Search Report (PCT/ISA/210) dated Dec. 19, 2014, by the Japanese Patent Office as the International Searching Authority for International Application No. PCT/FR2014/052313.

Written Opinion (PCT/ISA/237) dated Dec. 19, 2014, by the Japanese Patent Office as the International Searching Authority for International Application No. PCT/FR2014/052313.

* cited by examiner

*Primary Examiner* — Tae-Sik Kang
(74) *Attorney, Agent, or Firm* — Buchanan Ingersoll & Rooney P.C.

(57) ABSTRACT

A thermoplastic composition including a mixture of three particular and different polyolefins, including one of a polyamide-grafted polyolefin having particular polyamide grafts (type and quantity), for example, a polyamide-grafted polymer having a polyolefin trunk containing a residue of at least one unsaturated monomer and a plurality of polyamide grafts. Also, a thermoplastic film and, more specifically, a film for encapsulating a photovoltaic module incorporating the polyamide-grafted polyolefin composition.

14 Claims, No Drawings

THERMOPLASTIC COMPOSITION, IN PARTICULAR FOR PHOTOVOLTAIC MODULES

FIELD OF THE INVENTION

The invention relates to a thermoplastic composition comprising at least a first particular polyolefin combined with a second polyamide-grafted polyolefin whose grafts have a glass transition temperature, or melting point, of less than 160° C. The present invention also relates to the use of this composition in a photovoltaic module, more precisely in one or more layers forming such a module, more particularly in the layer forming the encapsulant.

Global warming, associated with the greenhouse gases given off by fossil-based energy sources, has led to the development of alternative energy solutions that do not emit such gases during their functioning, for instance photovoltaic modules. A photovoltaic module comprises a "photovoltaic cell", this cell being capable of converting light energy into electricity.

Many types of structures exist for photovoltaic panels.

The structure of a photovoltaic module conventionally comprises three layers, a central layer housing the photovoltaic cells that have photoelectric properties, surrounded on either side by a protective layer.

The central layer is conventionally known as the encapsulant, whereas the protective layers are known as the "frontsheet", which is a transparent layer that allows the passage of solar rays, and the "backsheet", this layer needing to be as leaktight/hemietic as possible.

In the presence of solar radiation, heating is generated inside the solar module and temperatures of 80° C. (or more) may be reached, which requires the layers to be solidly attached to each other throughout the life cycle of the module.

In general, since photovoltaic modules are placed outdoors and in extreme environments, they are subject to constant stresses and attack. Finally, the properties of the thermoplastic materials used must make it possible to ensure long-term conservation of the photoelectric properties of the module, in other words to ensure that they do not suffer appreciable degradation.

In terms of the physicochemical properties of these thermoplastic materials, mention may be made especially of excellent creep resistance at 100° C. or more, good optical properties, good durability properties in humid heat and under UV (ultraviolet), good electrical properties, low water uptake and excellent barrier properties.

PRIOR ART

At the present time, crosslinkable compositions consisting of polyolefins, in particular of EVA (ethylene-vinyl acetate) type, are known in the field of photovoltaic modules, for forming the encapsulant. However, problems of durability of the photovoltaic modules are encountered with this type of encapsulant, which are especially associated with the release of acetic acid in humid heat (85° C./85% HR: "Humidity Rate") which accelerates the corrosion of the cells. It is also known that photovoltaic modules manufactured with these ethylene-vinyl acetate copolymers as encapsulant are particularly sensitive to the problem of degradation induced under a potential difference, which is better known under the abbreviation PID for "Potential Induced Degradation". Thermoplastic encapsulants of polyolefin type are also known. The problem with these thermoplastics is that they do not withstand creep, which makes them unsuitable for such an application.

A polyamide-grafted polyolefin composition (polyamide grafts attached to the main chain) is moreover known. Such compositions are described in the Applicant's patents FR 2 918 150 or EP 2 196 489. It has even already been envisaged to mix such polyamide-grafted polyolefins with a polyolefin, especially in WO 02/28959 in the name of the Applicant.

However, such mixtures may have a major defect for photovoltaic application. Specifically, these mixtures give rise to a high moisture content (substantial water uptake), which limits the durability of the photovoltaic modules (drop in yield) after a certain time of use or during tests in humid heat under polarization.

BRIEF DESCRIPTION OF THE INVENTION

It has been found by the Applicant, after various experiments and manipulations, that, contrary to the teachings well known to those skilled in the art, a particular choice of polyamide grafts (for the polyamide-grafted polyolefin), present in a quite specific weight content in the composition, combined with that of two specific polyolefins, in suitable contents, makes it possible to solve the problems associated with the compositions of the prior art, in particular that disclosed in WO 02/28959.

Thus, the composition according to the present invention, while maintaining entirely satisfactory mechanical, thermomechanical, optical and electrical properties, addresses the final deficiencies that may be presented by these thermoplastic materials which are otherwise extremely efficient, namely that this composition has low or even very low water uptake and particularly improved degradation over time (drop in electrical resistivity).

Thus, the present invention relates to a thermoplastic composition comprising at least a mixture of three polymers, in which:

- the first polymer, present in the composition at between 10% and 70% by weight, consists of a polyamide-grafted polymer having a polyolefin trunk containing a residue of at least one unsaturated monomer (X) and a plurality of polyamide grafts, in which:
  - the polyamide grafts are attached to the polyolefin trunk via the unsaturated monomer residue (X) comprising a function that is capable of reacting via a condensation reaction with a polyamide bearing at least one amine end group and/or at least one carboxylic acid end group,
  - the unsaturated monomer residue (X) is attached to the trunk by grafting or copolymerization,
  - the polyamide grafts represent from 10% to 60% and preferably from 15% to 55% by weight of said polyamide-grafted polymer,
- the second polymer, present in the composition at between 10% and 90% by weight, consists of a copolymer of ethylene and of an unreactive or non-functionalized comonomer whose flexural elastic modulus is less than 250 MPa at 23° C. and which has a crystal melting point of between 60° C. and 120° C.,
- the third polymer, present in the composition at between 3% and 45% by weight of said composition, consisting of a functionalized polyolefin comprising a copolymer of at least one alpha-olefin, such as ethylene or propylene, with at least one comonomer bearing a reactive function, and at least one other comonomer not bearing a reactive function, chosen from an alpha-olefin different from the abovementioned alpha-olefin, a diene, an unsaturated carboxylic acid ester, and a vinyl ester of a carboxylic acid, a dicarboxylic acid anhydride such as maleic anhydride, characterized in that the polyamide grafts of the abovementioned first polymer have a glass transition temperature and a melting point of less than or equal to 160° C., and in that the content of polyamide grafts in said first polymer represents from 3% to 15% and preferably between 5% and 12.5% by weight of the thermoplastic composition.

According to a possibility offered by the invention, the second polymer will consist of a copolymer of ethylene and of an alkyl(meth)acrylate.

Preferably, the third polymer consists of an ethylene-acrylic ester-glycidyl methacrylate or ethylene-acrylic ester-maleic anhydride copolymer.

Advantageously, the third polymer is present at between 10% and 30% by weight of the composition.

Other advantageous characteristics of the invention are specified hereinbelow:

Advantageously, the number-average molar mass of the abovementioned polyamide grafts of the abovementioned grafted polymer is within the range from 1000 to 10 000 g/mol.

According to a particular feature of the invention, for the abovementioned grafted polymers, the number of monomers (X) attached to the polyolefin trunk is greater than or equal to 1.3 and/or less than or equal to 20.

According to one aspect of the invention, the abovementioned first polymer is present at between 10% and 50% by weight of the composition.

Preferably, the polyamide grafts of the first polymer consist of copolyamides chosen from the copolyamides PA 6/11, PA 6/12 and PA 6/11/12.

Preferably, the unsaturated monomer (X) of the first polymer is a maleic anhydride.

Preferably, the second polymer is present in the composition at between in the composition at between 40% and 70% by weight.

According to a possibility offered by the invention, the composition according to the invention consists solely of the three abovementioned polymers.

The invention also relates to a film comprising the composition according to the invention as described above.

The invention also relates to a thermoplastic film of a photovoltaic module, said photovoltaic module comprising at least two layers, one of which forms the encapsulant layer, characterized in that the encapsulant layer comprises, and preferably consists of, the thermoplastic composition as described previously.

Preferably, the layer forming the encapsulant comprises adhesion promoters consisting of a non-polymeric ingredient, of organic, crystalline or mineral and more preferentially semi-mineral semi-organic nature, antioxidants and/or UV stabilizers.

It should be noted that the composition according to the invention is presented with, for application, a photovoltaic module, more particularly its encapsulant layer, but, needless to say, this composition may be envisaged for any other application in which such a composition may advantageously be used, especially in multilayer structures, for instance shoes, films or adhesive coatings, or fluid transportation tubes.

The description that follows is given solely as a nonlimiting illustration.

DETAILED DESCRIPTION OF THE INVENTION

As regards the abovementioned first polymer, it is thus a grafted polymer, with between 10% and 70% and preferably between 15% and 55% by mass of polyamide grafts and a number of monomers (X) of between 1.3 and 20.

As regards the polyolefin trunk, it is a polymer comprising an alpha-olefin as monomer.

Alpha-olefins containing from 2 to 30 carbon atoms are preferred.

Alpha-olefins that may be mentioned include ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene and 1-triacontene.

Mention may also be made of cyclo-olefins containing from 3 to 30 carbon atoms and preferentially from 3 to 20 carbon atoms, such as cyclopentane, cycloheptene, norbornene, 5-methyl-2-norbornene, tetracyclododecene and 2-methyl-1,4,5,8-dimethano-1,2,3,4,4a,5,8,8a-octahydronaphthalene; di- and polyolefins, such as butadiene, isoprene, 4-methyl-1,3-pentadiene, 1,4-pentadiene, 1,5-hexadiene, 1,3-hexadiene, 1,3-octadiene, 1,4-octadiene, 1,5-octadiene, 1,6-octadiene, ethylidenenorbornene, vinylnorbornene, dicyclopentadiene, 7-methyl-1,6-octadiene, 4-ethylidiene-8-methyl-1,7-nonadiene and 5,9-dimethyl-1,4,8-decatriene; vinyl aromatic compounds such as mono- or poly alkylstyrenes (comprising styrene, o-methylstyrene, m-methylstyrene, p-methylstyrene, o,p-dimethylstyrene, o-ethylstyrene, m-ethylstyrene and p-ethylstyrene), and derivatives comprising functional groups such as methoxystyrene, ethoxystyrene, vinylbenzoic acid, methylvinyl benzoate, benzylvinyl acetate, hydroxystyrene, o-chlorostyrene, p-chlorostyrene, divinylbenzene, 3-phenylpropene, 4-phenylpropene, α-methylstyrene, vinyl chloride, 1,2-difluoroethylene, 1,2-dichloroethylene, tetrafluoroethylene and 3,3,3-trifluoro-1-propene.

In the context of the present invention, the term “alpha-olefin” also comprises styrene. Propylene and most especially ethylene are preferred as alpha-olefins This polyolefin may be a homopolymer when only one alpha-olefin is polymerized in the polymer chain. Examples that may be mentioned include polyethylene (PE) or polypropylene (PP).

This polyolefin may also be a copolymer when at least two comonomers are copolymerized in the polymer chain, one of the two comonomers, known as the “first comonomer”, being an alpha-olefin and the other comonomer, known as the “second comonomer”, is a monomer that is capable of polymerizing with the first monomer.

As second comonomer, mention may be made of:

- one of the alpha-olefins already mentioned, this being different from the first alpha-olefin comonomer,
- dienes, for instance 1,4-hexadiene, ethylidenenorbornene or butadiene
- unsaturated carboxylic acid esters, for instance alkyl acrylates or alkyl methacrylates grouped under the term “alkyl(meth)acrylates”. The alkyl chains of these (meth)acrylates may contain up to 30 carbon atoms. Alkyl chains that may be mentioned include methyl, ethyl, propyl, n-butyl, sec-butyl, isobutyl, tert-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, hencosyl, docosyl, tricosyl, tetracosyl, pentacosyl, hexacosyl, heptacosyl, octacosyl and nonacosyl. Methyl, ethyl and butyl (meth)acrylates are preferred as unsaturated carboxylic acid esters.

vinyl esters of carboxylic acids. Examples of vinyl esters of carboxylic acids that may be mentioned include vinyl acetate, vinyl versatate, vinyl propionate, vinyl butyrate and vinyl maleate. Vinyl acetate is preferred as vinyl ester of a carboxylic acid.

Advantageously, the polyolefin trunk comprises at least 50 mol % of the first comonomer; its density may advantageously be between 0.91 and 0.96.

The preferred polyolefin trunks are constituted of an ethylene-alkyl(meth)acrylate copolymer. Using this polyolefin trunk, excellent aging behavior with respect to light and temperature is obtained.

It would not constitute a departure from the context of the invention if various "second comonomers" were copolymerized in the polyolefin trunk.

According to the present invention, the polyolefin trunk contains at least one unsaturated monomer residue (X) which can react with an acid and/or amine function of the polyamide graft via a condensation reaction. According to the definition of the invention, the unsaturated monomer (X) is not a "second comonomer".

As unsaturated monomer (X) included on the polyolefin trunk, mention may be made of:

unsaturated epoxides. Among these, they are, for example, aliphatic glycidyl esters and ethers such as allyl glycidyl ether, vinyl glycidyl ether, glycidyl maleate and itaconate, and glycidyl acrylate and methacrylate. They are also, for example, alicyclic glycidyl esters and ethers such as 2-cyclohexene-1-glycidyl ether, cyclohexene-4,5-diglycidyl carboxylate, cyclohexene-4-glycidyl carboxylate, 5-norbornene-2-methyl-2-glycidyl carboxylate and endocis-bicyclo(2,2,1)-5-heptene-2,3-diglycidyl dicarboxylate. It is preferred to use glycidyl methacrylate as unsaturated epoxide.

unsaturated carboxylic acids and salts thereof, for example acrylic acid or methacrylic acid and salts of these same acids.

carboxylic acid anhydrides. They may be chosen, for example, from maleic, itaconic, citraconic, allylsuccinic, cyclohex-4-ene-1,2-dicarboxylic, 4-methylenecyclohex-4-ene-1,2-dicarboxylic, bicyclo(2,2,1)hept-5-ene-2,3-dicarboxylic and x-methylbicyclo(2,2,1)hept-5-ene-2,2-dicarboxylic anhydride.

It is preferred to use maleic anhydride as carboxylic acid anhydride.

The unsaturated monomer (X) is preferably chosen from an unsaturated carboxylic acid anhydride and an unsaturated epoxide. In particular, to perform the condensation of the polyamide graft with the polyolefin trunk, in the case where the reactive end group of the polyamide graft is a carboxylic acid function, the unsaturated monomer (X) is preferentially an unsaturated epoxide. In the case where the reactive end group of the polyamide graft is an amine function, the unsaturated monomer (X) is advantageously an unsaturated epoxide and preferentially an unsaturated carboxylic acid anhydride.

According to an advantageous version of the invention, the preferred number of unsaturated monomers (X) attached on average to the polyolefin trunk is greater than or equal to 1.3 and/or preferentially less than or equal to 20.

Thus, if (X) is maleic anhydride and the number-average molar mass of the polyolefin is 15 000 g/mol, it has been found that this corresponded to a proportion of anhydride of at least 0.8% by mass of the polyolefin trunk as a whole and not more than 6.5%. These values associated with the mass of the polyamide grafts determine the proportion of polyamide and of trunk in the polyamide-grafted polymer.

The polyolefin trunk containing the unsaturated monomer residue (X) is obtained by polymerization of the monomers (first comonomer, second optional comonomer, and optionally unsaturated monomer (X)). This polymerization may be performed via a radical process at high pressure or a solution process, in an autoclave or tubular reactor, these processes and reactors being well known to those skilled in the art. When the unsaturated monomer (X) is not copolymerized in the polyolefin trunk, it is grafted to the polyolefin trunk. Grafting is also an operation that is known per se. The composition would be in accordance with the invention if several different functional monomers (X) were copolymerized and/or grafted onto the polyolefin trunk.

Depending on the types and ratio of monomers, the polyolefin trunk may be semicrystalline or amorphous. In the case of amorphous polyolefins, only the glass transition temperature is observed, whereas in that of the semicrystalline polyolefins, a glass transition temperature and a melting point (which will necessarily be higher) are observed. It will suffice for a person skilled in the art to select the ratios of monomer and the molecular masses of the polyolefin trunk in order to be able readily to obtain the desired values for the glass transition temperature, optionally the melting point and also the viscosity of the polyolefin trunk.

Preferably, the polyolefin has a melt flow index (MFI) of between 3 and 400 g/10 min (190° C., 2.16 kg, ASTM D 1238).

The polyamide grafts are chosen here to have a glass transition temperature and a melting point of less than 160° C.

Mention may be made especially of cycloaliphatic homopolyamides which result from the condensation of a cycloaliphatic diamine and of an aliphatic diacid.

Examples of cycloaliphatic diamines that may be mentioned include 4,4'-methylenebis(cyclohexylamine), also known as para-bis(aminocyclohexyl)methane or PACM, and 2,2'-dimethyl-4,4'-methylenebis(cyclohexylamine), also known as bis(3-methyl-4-aminocyclohexyl)methane or BMACM.

Thus, among the cycloaliphatic homopolyamides, mention may be made of the polyamides PACM.12, resulting from the condensation of PACM with the C12 diacid, BMACM.10 and BMACM.12 resulting from the condensation of BMACM with, respectively, the C10 and C12 aliphatic diacids. All these compounds are known to those skilled in the art.

The polyamide grafts included in the composition according to the invention are preferentially copolyamides. They result from the polycondensation of at least two of the groups of monomers listed above for producing homopolyamides. In the present description of the copolyamides, the term "monomer" should be taken in the sense of a "repeating unit". Specifically, the case where a repeating unit of the PA is constituted from the combination of a diacid with a diamine is particular. It is considered that it is the combination of a diamine and of a diacid, i.e. the diamine-diacid couple (in equimolar amounts), which corresponds to the monomer. This is explained by the fact that, individually, the diacid or the diamine is only one structural unit, which is insufficient by itself to polymerize to give a polyamide.

Thus, the copolyamides especially cover the condensation products:

of at least two lactams, of at least two aliphatic alpha, omega-aminocarboxylic acids, of at least one lactam and of at least one aliphatic alpha, omega-aminocarboxylic acid, of at least two diamines and of at least two diacids, of at least one lactam with at least one diamine and at least one diacid, of at least one aliphatic alpha, omega-aminocarboxylic acid with at least one diamine and at least one diacid, the diamine(s) and the diacid(s) possibly being, independently of each other, aliphatic, cycloaliphatic or aromatic.

Depending on the types and ratio of monomers, the copolyamides may be semicrystalline or amorphous. In the case of amorphous copolyamides, only the glass transition temperature is observed, whereas, in that of the semicrystalline copolyamides, a glass transition temperature and a melting point (which will necessarily be higher) are observed.

Among the copolyamides, use may also be made of semicrystalline copolyamides and particularly those of the type PA 6/11, PA 6/12 and PA 6/11/12.

The degree of polymerization may vary within wide proportions; depending on its value, it is a polyamide or a polyamide oligomer.

Advantageously, the polyamide grafts are monofunctional.

In order for the polyamide graft to bear a monoamine end group, it suffices to use a chain limiter of formula:

$$R_1—NH$$
$$|$$
$$R_2$$

in which:

R1 is hydrogen or a linear or branched alkyl group containing up to 20 carbon atoms, R2 is a linear or branched, alkyl or alkenyl group containing up to 20 carbon atoms, a saturated or unsaturated cycloaliphatic radical, an aromatic radical or a combination of the preceding. The limiter may be, for example, laurylamine or oleylamine.

In order for the polyamide graft to bear a monocarboxylic acid end group, it suffices to use a chain limiter of formula R'1-COOH, R'1-CO—O—CO—R'2 or a dicarboxylic acid.

R'1 and R'2 are linear or branched alkyl groups containing up to 20 carbon atoms.

Advantageously, the polyamide graft has an end group bearing amine functionality The preferred monofunctional polymerization limiters are laurylamine and oleylamine The polyamide grafts have a molar mass of between 1000 and 10 000 g/mol. Given that the stoichiometric ratio for the grafting of the polyamide grafts onto the polyolefin trunk is constant, the choice of the mass of the polyamide grafts depends on the desired mass of polyamide in the composition as has been explained previously.

It will suffice for a person skilled in the art to select the types and ratio of monomers and also to choose the molar masses of the polyamide grafts in order to be able readily to obtain the desired values for the glass transition temperature, optionally for the melting point and also for the viscosity of the polyamide graft.

The condensation reaction of the polyamide graft onto the polyolefin trunk containing the X residue is performed by reacting an amine or acid function of the polyamide graft with the X residue. Advantageously, polyamide monoamine grafts are used and amide or imide bonds are created by reacting the amine function with the function of the X residue.

This condensation is preferably performed in the melt. To manufacture the composition according to the invention, use may be made of standard blending and/or extrusion techniques. The components of the composition are thus mixed to form a compound which may optionally be granulated on exiting the die. Advantageously, coupling agents are added during the compounding.

To obtain a nanostructured composition, it is thus possible to mix the polyamide graft and the trunk in an extruder, at a temperature generally between 200 and 300° C. The mean residence time of the molten material in the extruder may be between 5 seconds and 5 minutes and preferably between 20 seconds and 1 minute. The yield for this condensation reaction is evaluated by selective extraction of the free polyamide grafts, i.e. those that have not reacted to form the polyamide-grafted polymer.

The preparation of polyamide grafts bearing an amine end group and their addition to a polyolefin trunk containing the (X) residue is described in patents U.S. Pat. Nos. 3,976,720, 3,963,799, 5,342,886 and FR 2 291 225. The polyamide-grafted polymer of the present invention advantageously has a nanostructured organization.

As regards the second polymer, it is one—the second polymer, present in the composition at between 10% and 90% by weight, consists of a copolymer of ethylene and of an unreacted or non-functionalized comonomer whose flexural elastic modulus is less than 250 MPa at 23° C. and which has a crystal melting point of between 60° C. and 120° C.

Advantageously, according to one embodiment, this second polymer consists of a copolymer of ethylene and of an alkyl(meth)acrylate.

In other words, this second polymer consists of a homopolymer of an olefin or a copolymer of at least one alpha-olefin and of at least one other copolymerizable monomer, provided, of course, that the modulus and crystal melting point conditions are respected.

Advantageously, the flexible polyolefin is chosen from polyethylene homopolymers or copolymers.

Comonomers that may be mentioned include:

alpha-olefins, advantageously those containing from 3 to 30 carbon atoms.

Examples of alpha-olefins containing 3 to 30 carbon atoms as optional comonomers comprise propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene and 1-triacontene. These alpha-olefins may be used alone or as a mixture of two or more than two.

unsaturated carboxylic acid esters, for instance alkyl (meth)acrylates, the alkyls possibly containing up to 24 carbon atoms.

Examples of alkyl acrylates or methacrylates are especially methyl methacrylate, ethyl acrylate, n-butyl acrylate, isobutyl acrylate and 2-ethylhexyl acrylate.

vinyl esters of saturated carboxylic acids, for instance vinyl acetate or propionate.

dienes, for instance 1,4-hexadiene.

The flexible polyolefin may comprise several comonomers.

Examples that may be mentioned include:

low-density polyethylene (LDPE)

linear low-density polyethylene (LLDPE)

very-low-density polyethylene (VLDPE)

polyethylene obtained by metallocene catalysis, i.e. polymers obtained by copolymerization of ethylene and of alpha-olefin such as propylene, butene, hexene or octene in the presence of a single-site catalyst generally constituted of a zirconium or titanium atom and of two cyclic alkyl molecules linked to the metal. More specifically, metallocene catalysts are usually composed of two cyclopentadiene rings linked to the metal. These catalysts are frequently used with aluminoxanes as cocatalysts or activators, preferably methylaluminoxane (MAO). Hafnium may also be used as metal to which the cyclopentadiene is attached. Other metallocenes may include transition metals from groups IV A, V A and VI A. Metals of the lanthanide series may also be used.

EPR (ethylene-propylene-rubber) elastomers

EPDM (ethylene-propylene-diene) elastomers mixtures of polyethylene with an EPR or an EPDM ethylene-alkyl(meth)acrylate copolymers which may contain up to 60% by weight of (meth)acrylate and preferably 2% to 40%.

Examples that may be mentioned include flexible ethylene copolymers such as the copolymers obtained via a radical route at high pressure of ethylene with vinyl acetate, (meth)acrylic esters of (meth)acrylic acid and of an alcohol containing from 1 to 24 and advantageously from 1 to 9 carbon atoms, radical terpolymers also using a third monomer chosen from unsaturated monomers that are copolymerizable with ethylene, such as acrylic acid, maleic anhydride or glycidyl methacrylate. These flexible copolymers may also be copolymers of ethylene with alpha-olefins of 3 to 8 carbon atoms such as EPR, very-low-density copolymers of ethylene with butene, hexene or octene, with a density of between 0.870 and 0.910 g/cm$^3$, obtained by metallocene or Ziegler-Natta catalysis. The term "flexible polyolefins" also means mixtures of two or more flexible polyolefins.

The invention is particularly useful for copolymers of ethylene and of alkyl (meth)acrylates. The alkyl may contain up to 24 carbon atoms. Preferably, the (meth)acrylates are chosen from those mentioned above. These copolymers advantageously comprise up to 40% by weight of (meth) acrylate and preferably 3% to 35%. Their MFI is advantageously between 0.1 and 50 (at 190° C.-2.16 kg).

Advantageously, the flexural modulus is between 5 and 150 MPa.

As regards the optional third polymer according to the invention, it is a functionalized polyolefin comprising a copolymer of at least one alpha-olefin, such as ethylene or propylene, with at least one comonomer bearing a reactive function, chosen especially from a carboxylic acid, such as (meth)acrylic acid, a carboxylic anhydride, such as maleic anhydride, or an epoxide, such as glycidyl(meth)acrylate, and at least one other comonomer not bearing a reactive function, chosen, for example, from a different alpha-olefin; a diene such as butadiene; an unsaturated carboxylic acid ester, such as an alkyl(meth)acrylate in which the alkyl group may be a methyl, ethyl or butyl group, especially; and a vinyl ester of a carboxylic acid, such as vinyl acetate.

Examples of reactive comonomers that may be mentioned include:

unsaturated epoxides.

Examples of unsaturated epoxides are especially:

aliphatic glycidyl esters and ethers such as allyl glycidyl ether, vinyl glycidyl ether, glycidyl maleate and itaconate, and glycidyl acrylate and methacrylate, and alicyclic glycidyl esters and ethers such as 2-cyclohexene-1-glycidyl ether, cyclohexene-4,5-diglycidyl carboxylate, cyclohexene-4-glycidyl carboxylate, 5-norbornene-2-methyl-2-glycidyl carboxylate and endocis-bicyclo(2,2,1)-5-heptene-2,3-diglycidyl dicarboxylate, unsaturated carboxylic acids, salts thereof and anhydrides thereof.

Examples of unsaturated dicarboxylic acid anhydrides are especially maleic anhydride, itaconic anhydride, citraconic anhydride and tetrahydrophthalic anhydride.

As examples of copolymers comprising a reactive comonomer, mention may be made of:

ethylene-alkyl(meth)acrylate-maleic anhydride copolymers obtained by copolymerization of the three monomers, the proportions of (meth)acrylate being like the above copolymers, the amount of maleic anhydride being up to 10% and preferably 0.2% to 6% by weight, ethylene-vinyl acetate-maleic anhydride copolymers obtained by copolymerization of the three monomers, the proportions being the same as in the preceding copolymer.

It is preferred for the functionalized polyolefin to contain from 60% to 100% by weight of alpha-olefin and from 0 to 40% by weight and preferably from 0 to 15% by weight of comonomer not bearing a reactive function. It is also preferred for the functionalized polyolefin to contain from 0.1% to 15% by weight, preferably from 0.5% to 5% by weight, of comonomer bearing a reactive function. Examples of such functionalized polyolefins are ethylene/acrylic ester/glycidyl methacrylate and ethylene/acrylic ester/maleic anhydride copolymers, which are available, respectively, from the company Arkema under the trade names Lotader® GMA and Lotader® MAH.

Supplements, or adjuvants, may optionally be added to the composition according to the invention so as to give this composition such or such additional functionality.

In this particular application of the composition to photovoltaic modules, since UV (ultraviolet) radiation is liable to result in slight yellowing of the composition used, UV stabilizers and UV absorbers such as benzotriazole, benzophenone and other bulky amines may be added so as to ensure the transparency of the encapsulant during its lifetime. These compounds may be, for example, based on benzophenone or on benzotriazole. They may be added in amounts of less than 10% by mass relative to the total mass of the composition and preferentially from 0.1% to 5%.

Antioxidants may also be added to limit yellowing during the manufacture of the encapsulant, such as phosphorus-based compounds (phosphonites and/or phosphites) and bulky phenolic compounds. These antioxidants may be added in amounts of less than 10% by mass relative to the total mass of the composition and preferentially from 0.1% to 5%.

Flame retardants may also be added. These agents may be halogenated or non-halogenated. Among the halogenated agents, mention may be made of brominated products. Use may also be made, as non-halogenated agent, of phosphorus-based additives such as ammonium phosphate, polyphosphate, phosphinate or pyrophosphate, melamine cyanurate, pentaerythritol, zeolites, and also mixtures of these agents. The composition may comprise these agents in proportions ranging from 3% to 40% relative to the total mass of the composition.

If it is desired in a particular application, pigments may also be added, for instance colorants or optical brighteners, in proportions generally ranging from 5% to 15% relative to the total mass of the composition.

As regards the other aspects of the invention relating to the use of the composition according to the invention in a photovoltaic module, a person skilled in the art can refer, for example, to the "Handbook of Photovoltaic Science and Engineering", Wiley, 2003, volume 7.

Preparation of the Composition According to the Invention:

The technique for grafting the polyamide grafts onto the polyolefin trunk to obtain the polyamide-grafted polyolefin according to the invention is well known to those skilled in the art, especially from the documents mentioned previously FR 2 912 150, FR 2 918 150 or EP 21966489.

It would therefore not constitute a departure from the scope of the invention if crosslinking agents were added. Examples that may be mentioned include isocyanates or organic peroxides. This crosslinking may also be performed via known irradiation techniques. This crosslinking may be performed via one of the many methods known to those skilled in the art, especially by using heat-activated initiators, for example peroxide and azo compounds, photoinitiators such as benzophenone, via radiation techniques comprising light rays, UV rays, electron beams and x-rays, silanes bearing reactive functions such as an amino silane, an epoxy silane, a vinyl silane, for instance triethoxy or trimethoxy vinyl silane, and crosslinking via a wet route. The manual entitled "Handbook of polymer foams and technology" above, on pages 198 to 204, gives additional teaching to which a person skilled in the art may refer.

As regards the aspects of the invention relating to the use of the thermoplastic composition in a photovoltaic module, a person skilled in the art may refer, for example, to the Handbook of Photovoltaic Science and Engineering, Wiley, 2003. Specifically, the composition of the invention may be used as encapsulant or encapsulant-backsheet in a photovoltaic module, the structure of which is described in relation with the attached figures.

Materials Used to Form the Formulations Tested:

Lotader® 7500: terpolymer of ethylene, ethyl acrylate (17.5% by weight) and maleic anhydride (2.8% by weight) produced by Arkema, having an MFI (190° C. under 2.16 kg measured according to ISO 1133) of 70 g/10 min (minutes).

Lotader® 5500: terpolymer of ethylene, ethyl acrylate (20% by weight) and maleic anhydride (2.8% by weight) produced by Arkema, having an MFI (190° C. under 2.16 kg measured according to ISO 1133) of 20 g/10 min.

Lotryl® 17 BA07: copolymer of ethylene and of butyl acrylate (17% by weight) produced by Arkema, having an MFI (190° C. under 2.16 kg measured according to ISO 1133) of 7 g/10 min.

Lotryl® 18MA02: copolymer of ethylene and of methyl acrylate (18% by weight) produced by Arkema, having an MFI (190° C. under 2.16 kg measured according to ISO 1133) of 2 g/10 min.

Elvaloy® AC 1820: copolymer of ethylene and of methyl acrylate (20% by weight) produced by Dupont, having an MFI (190° C. under 2.16 kg measured according to ISO 1133) of 8 g/10 min Prepolymer PA6: a prepolymer PA6 was synthesized by polycondensation from lactam 6. Laurylamine is used as chain limiter so as to have a single primary amine functionality at the end of the chain. The number-average molar mass of the first prepolymer is 2500 g/mol.

Copolyamide 6/12 prepolymer with a melting point of 130° C.: a copolyamide 6/12 prepolymer was synthesized by polycondensation from lactam 6 and lactam 12. The lactam 6/lactam 12 ratio is adjusted to obtain a melting point of 130° C. Laurylamine is used as chain limiter so as to have a single primary amine functionality at the end of the chain. Its number-average molar mass is 2500 g/mol.

Copolyamide 6/11 prepolymer with a melting point of 150° C.: a copolyamide 6/11 prepolymer was synthesized by polycondensation from lactam 6 and amino 11. The lactam 6/amino 11 ratio is adjusted to obtain a melting point of 150° C. Laurylamine is used as chain limiter so as to have a single primary amine functionality at the end of the chain. Its number-average molar mass is 3200 g/mol.

Apolhya®: the Apolhya family is a family of polymers sold by Arkema which combine the properties of polyamides with those of polyolefins by producing co-continuous morphologies at the nanometric scale. In the context of the tests, several types of Apolhya® are retained:

- Apolhya A on the basis of Lotader® 7500 and copolyamide 6/12 with a melting point of 130° C. containing 20% by weight of copolyamide.
- Apolhya B on the basis of Lotader® 7500 and copolyamide 6/11 with a melting point of 150° C. containing 20% by weight of polyamide.
- Apolhya C on the basis of Lotader® 7500 and polyamide 6 with a melting point of 220° C. containing 20% by weight of polyamide.
- Apolhya D on the basis of Lotader® 7500 and polyamide 11 with a melting point of 190° C. containing 20% by weight of copolyamide.
- Apolhya E on the basis of Lotader® 7500 and polyamide 6/12 with a melting point of 130° C. containing 50% by weight of copolyamide.
- Apolhya F on the basis of Lotader® 5500 and polyamide 6/12 with a melting point of 130° C. containing 20% by weight of copolyamide.

| | Content of polyamide in the composition | Apolhya | | | | | | Lotryl | Lotryl | Elvaloy | Lotader | Lotader |
|---|---|---|---|---|---|---|---|---|---|---|---|---|
| Compositions | (mass %) | A | B | C | D | E | F | 17BA07 | 18MA02 | AC 1820 | 5500 | 7500 |
| Example 1 | 3.5 | 17.5 | | | | | | 72.5 | | | 10 | |
| Example 2 | 6 | 30 | | | | | | 60 | | | 10 | |
| Example 3 | 11 | 55 | | | | | | 35 | | | | 10 |
| Example 4 | 11 | 55 | | | | | | 35 | | | | 10 |
| Example 5 | 12.5 | 62.5 | | | | | | 27.5 | | | 10 | |
| Example 6 | 8 | | | | | 16 | | | 60 | | 24 | |
| Example 7 | 8 | | | | | 16 | | | | 60 | | 24 |
| Example 8 | 7.5 | | | | | | 37.5 | 12.5 | 40 | | 10 | |
| Example 9 | 8 | 40 | | | | | | | | 50 | | 10 |
| Example 10 | 8 | | | | | 16 | | | 79 | | | 5 |
| Comparative example 1 | 2 | 10 | | | | | | 90 | | | | |

-continued

| Compositions | Content of polyamide in the composition (mass %) | Apolhya A | B | C | D | E | F | Lotryl 17BA07 | Lotryl 18MA02 | Elvaloy AC 1820 | Lotader 5500 | Lotader 7500 |
|---|---|---|---|---|---|---|---|---|---|---|---|---|
| Comparative example 2 | 17 | 85 | | | | | | 15 | | | | |
| Comparative example 3 | 20 | | 100 | | | | | | | | | |
| Comparative example 4 | 13 | | | 65 | | | | 35 | | | | |
| Comparative example 5 | 13 | | | | 65 | | | 35 | | | | |

Production of the Formulations and Films Tested:

Reactive extrusion of the formulations

Reactive extrusion of the Apolhya formulations on the basis of Lotader 7500 or Lotader 5000 and copolyamides 6/12 and 6/11

These Apolhya® formulations were prepared by "compounding" by means of a Leistritz® co-rotating twin-screw extruder (L/D=35), the barrel elements of which are heated in a flat profile to 190° C.; the spin speed is 300 rpm (revolutions per minute) with a throughput of 15 kg/h (kilograms per hour).

Reactive extrusion of the Apolhya formulations on the basis of Lotader 7500 and polyamide 6

These Apolhya® formulations were prepared by "compounding" by means of a Leistritz® co-rotating twin-screw extruder (L/D=35), the barrel elements of which are heated in a flat profile to 240° C.; the spin speed is 300 rpm (revolutions per minute) with a throughput of 15 kg/h (kilograms per hour).

Extrusion of 400 μm monolayer films of the Apolhya/polyolefin compositions of the invention and of the comparative examples 400 μm (micrometer) monolayer films were prepared by flat film extrusion on a small laboratory extrusion line. The compositions are obtained by mixing a polyamide-grafted polyolefin, a copolymer of ethylene and of an alkyl acrylate and optionally a third polyolefin functionalized with maleic anhydride. The proportions between the constituents are ensured by preparing a dry mixture in a bag of the granules prior to the extrusion.

The extruder is a Haake 1 counter-rotating twin-screw extruder equipped with a flat die 10 cm (centimeters) wide and with an aperture of 0.5 mm (millimeter). The barrel elements are heated in a flat profile to 160° C. for the illustrative examples of the invention based on copolyamide 6/12; the spin speed of the screws is 60 rpm (revolutions per minute). For the counter-examples of the invention based on polyamide 6, the barrel elements are heated in a flat profile to 220° C., the spin speed of the screws being 60 rpm. For the counter-examples of the invention based on polyamide 6/11, the barrel elements are heated in a flat profile to 180° C., the spin speed of the screws being 60 rpm.

Tests Performed on the Films:

Water Uptake Test:

The water uptake test consists in measuring the moisture content obtained at saturation in a 400 μm (micrometer) film after conditioning performed in humid heat at 85° C. and 85% relative humidity (RH). The moisture content measurement is performed according to the Karl-Fisher method based on standard ISO 15512. To measure the absorbed moisture content, the film is subjected to a step of thermal desorption under nitrogen for 20 minutes at 200° C.

Results of Water Uptake for the Various Samples:

| Compositions | Moisture content (%) |
|---|---|
| Example 1 | 0.25 |
| Example 2 | 0.31 |
| Example 3 | 0.41 |
| Example 4 | 0.41 |
| Example 5 | 0.43 |
| Example 6 | 0.31 |
| Example 7 | 0.32 |
| Example 8 | 0.32 |
| Example 9 | 0.37 |
| Example 10 | 0.29 |
| Counter-example 1 | 0.20 |
| Counter-example 2 | 0.54 |
| Counter-example 3 | 0.60 |
| Counter-example 4 | 0.58 |
| Counter-example 5 | 0.45 |

The above table of results shows schematically how the composition according to the invention was established. A result of greater than 0.50% on the water uptake test is disqualifying for the composition, in the application under consideration; it being, understood that, for a large number of other applications, this same disqualifying threshold of 0.50% for this test is liable to be applied.

The preferred composition domains for the composition according to the invention were established not only on the basis of this water uptake test, but also on tests of thermo-mechanical properties such as a test of creep at 100° C., of MFI (melt flow index) and also on tests relating to the optical properties (transparency test, test of yellowing under accelerated aging).

It was also found that the formulations according to the invention, namely composition examples 1 to 10, show excellent adhesive properties on glass, especially after a test of aging in humid heat at 85° C. and 85% HR (humidity rate).

It is important to note that, contrary to the rather satisfying result concerning comparative example 1, the latter is unsuitable for application since its creep resistance is insufficient.

Comparative example 4 is unsuitable for application since the water uptake is too high and the melting point of the polyamide is unsuitable for application. The product does not flow at the usual temperatures at which photovoltaic panels are manufactured.

Comparative example 5 is unsuitable for application since the melting point of the polyamide is unsuitable for application. Specifically, the product does not flow at the usual temperatures at which photovoltaic panels are manufactured.

The invention claimed is:

1. A thermoplastic composition comprising at least a mixture of three polymers, wherein the three polymers consist of a first polymer, a second polymer, and a third polymer, in which:

the first polymer, present in the composition at between 10% and 70% by weight, consists of a polyamide-grafted polymer having a polyolefin trunk containing a residue of at least one unsaturated monomer and a plurality of polyamide grafts, in which:

the polyamide grafts are attached to the polyolefin trunk via the residue of the at least one unsaturated monomer comprising a function that is capable of reacting via a condensation reaction with a polyamide bearing at least one amine end group and/or at least one carboxylic acid end group, the residue of the at least one unsaturated monomer is attached to the polyolefin trunk by grafting or copolymerization, the polyamide grafts represent from 10% to 60% by weight of said polyamide-grafted polymer, the second polymer, present in the composition at between 10% and 90% by weight, consists of a copolymer of ethylene and of an unreactive or non-functionalized comonomer whose flexural elastic modulus is less than 250 MPa at 23° C. and which has a crystal melting point of between 60° C. and 120° C., the third polymer, present in the composition at between 3% and 45% by weight of said composition, consisting of a functionalized polyolefin comprising a copolymer of at least one alpha-olefin with at least one comonomer bearing a reactive function, and at least one other comonomer not bearing a reactive function, chosen from the group consisting of an alpha-olefin different from the at least one alpha-olefin, a diene, an unsaturated carboxylic acid ester, a vinyl ester of a carboxylic acid, and a dicarboxylic acid anhydride, wherein the polyamide grafts of the first polymer have a glass transition temperature and a melting point of less than or equal to 160° C., and the content of the polyamide grafts in said first polymer represents from 3% to 15% by weight of the thermoplastic composition.

2. The composition as claimed in claim 1, wherein the unreactive or non-functionalized comonomer is an alkyl (meth)acrylate.

3. The composition as claimed in claim 1, wherein the number-average molar mass of the polyamide grafts of the polyamide-grafted polymer is within the range from 1000 to 10 000 g/mol.

4. The composition as claimed claim 1, wherein, for the polyamide-grafted polymer, the number of the residue of the at least one unsaturated monomer attached to the polyolefin trunk is greater than or equal to 1.3 and/or less than or equal to 20.

5. The composition as claimed in claim 1, wherein the first polymer is present in the composition at between 10% and 50% by weight.

6. The composition as claimed in claim 1, wherein the polyamide grafts of the first polymer consist of copolyamides chosen from the group consisting of PA 6/11, PA6/12 and PA6/11/12.

7. The composition as claimed in claim 1, wherein the third polymer consists of an ethylene-acrylic ester-glycidyl methacrylate or ethylene-acrylic ester-maleic anhydride copolymer.

8. The composition as claimed in claim 1, wherein the at least one unsaturated monomer of the first polymer is a maleic anhydride.

9. The composition as claimed in claim 1, wherein the second polymer is present at between 40% and 70% by weight in the composition.

10. The composition as claimed in claim 8, wherein the third polymer is present at between 10% and 30% by weight in the composition.

11. The composition as claimed in claim 1, wherein the composition consists solely of the three polymers.

12. A thermoplastic film comprising the composition as claimed in claim 1.

13. A thermoplastic film of a photovoltaic module, said photovoltaic module comprising at least two layers, wherein one of the at least two layers forms an encapsulant layer or a protective back layer, and wherein the encapsulant layer comprises the thermoplastic composition as claimed in claim 1.

14. The film as claimed in claim 13, wherein the one of the at least two layers forming the encapsulant layer comprises adhesion promoters consisting of a non-polymeric ingredient.

* * * * *